United States Patent
Westfall

(10) Patent No.: US 6,205,187 B1
(45) Date of Patent: Mar. 20, 2001

(54) PROGRAMMABLE SIGNAL DECODER

(75) Inventor: Dan L. Westfall, Livermore, CA (US)

(73) Assignee: General Dynamics Government Systems Corporation, Needham, MA (US)

( * ) Notice: Subject to any disclaimer, the term of this patent is extended or adjusted under 35 U.S.C. 154(b) by 0 days.

(21) Appl. No.: 08/989,614

(22) Filed: Dec. 12, 1997

(51) Int. Cl.[7] .............................. H03D 1/00; H03M 13/03
(52) U.S. Cl. ......................... 375/341; 375/341; 714/794
(58) Field of Search ........................... 375/341; 714/794, 714/795, 796, 746, 792

(56) References Cited

U.S. PATENT DOCUMENTS

| | | | |
|---|---|---|---|
| 4,077,021 | 2/1978 | Csajka et al. | 332/103 |
| 4,980,897 | 12/1990 | Decker et al. | 375/265 |
| 5,469,452 | * 11/1995 | Zehavi | 371/43 |
| 5,703,658 | * 12/1997 | Tsuru et al. | 348/554 |
| 5,914,988 | * 6/1999 | Hu et al. | 375/341 |
| 5,928,377 | * 7/1999 | Doran et al. | 714/786 |
| 5,983,383 | * 11/1999 | Wolf | 714/755 |

OTHER PUBLICATIONS

Collins, Oliver, "The Subtleties and Intricacies of Building a Constraint Length 15 Convolutional Decoder," IEEE Transactions on Communications, vol. 40. No. 12, pp. 1810–1819 (Dec. 1992).

Cremonesi, Paolo et al., "An Adjustable–Rate Multilevel Coded Modulation System: Analysis and Implementation," vol . . 4, No. 4, pp 43–49 (May–Jun. 1993).

Fettweis, Gerhard and Heinrich Meyr, "A 100MBit/s Viterbi Decoder Chip: Novel Architecture and its Realization," IEEE, pp. 463–467 (1990).

Forney, G. David, "The Viterbi Algorithm," Proceedings of the IEEE, vol. 61, No. 3, pp. 268–278 (Mar. 1973).

Michelson, Arnold M. and Allen H. Levesque, *Error–Control Techniques for Digital Communication,* John Wiley & Sons, pp. 55, 162–166.

Pottie, Gregory J. and Desmond P. Taylor, "Multilevel Codes Based on Partitioning," IEEE Transactions on Information Theory, vol. 35, No. 1, pp. 87–98 (Jan. 1989).

Ungerboeck, Gottfried, "Channel Coding with Multilevel/Phase Signals," IEEE Transactions on Information Theory, vol. IT–28,No. 1, pp. 55–67 (Jan. 1982).

Yasuda, Yutaka et al., "Development of Variable–Rate Viterbi Decoder and its Performance Characteristics," Proc. of Sixth ICDSC, Phoenix, AZ 1983, pp. XII–24–31.

Yasuda, Yutaka et al., "High–Rate Punctured Convolutional Codes for Soft Decision Viterbi Decoding," IEEE Transactions on Communications, vol. Comm–32, No. 3, pp. 315–319 (Mar. 1984).

Wei, Lee–Fang, "Trellis–Coded Modulation with Multidemensional Constellations," IEEE Transactions on Communication Theory, vol. IT–33, No. 4, pp. 483–501 (Jul. 1987).

* cited by examiner

*Primary Examiner*—Chi H. Pham
*Assistant Examiner*—Khai Tran
(74) *Attorney, Agent, or Firm*—Jenner & Block

(57) ABSTRACT

A programmable signal decoder processes incoming signals using any one of several predefined decoding schemes. The signal decoder is programmed to perform the desired decoding operations by downloading configuration data representative of the decoding scheme from a data memory to programmable logic in the signal decoder. Programmable metric tables provide set mapping. A generic four-level decoder structure includes two levels that are programmable Viterbi decoders, one level that is a Wagner decoder and another level that provides free bit selection operations. The four levels are combined, as needed, to implement two-dimensional, four-dimensional, multi-level and other coded modulation formats.

36 Claims, 6 Drawing Sheets

PROGRAMMABLE SIGNAL DECODER

FIELD OF THE INVENTION

The present invention relates to data communications systems and, more specifically, to a programmable signal decoder that performs decoding functions specified by decoder configuration data that has been downloaded into the decoder.

BACKGROUND OF THE INVENTION

Data communications systems transfer digital information over media such as copper wires or fiber optic cables by converting the digital information to signals that drive the media. In general, there is direct correspondence between the bandwidth of a signal and the rate at which that signal transmits information. However, in every transmission medium, there is a practical upper limit on the data rate of the signal which the medium can reliably pass.

Numerous data modulating schemes have been developed to increase the rate at which digital information can be passed through a medium with noise and limited bandwidth. One prevalent modulating scheme, known as quadrature amplitude shift keying ("QASK"), involves representing information by the amplitude and phase of the transmitted signal. The relative vector amplitude of the signal at predetermined instances in time represents a particular value, called a "symbol." The graphical representation of the vector relationships is referred to as a "constellation." Although systems that use QASK may achieve higher effective data throughput, ambient noise and other signal interference may affect the accuracy with which the equipment that receives the signal detects the relative amplitude of the signal.

To increase the likelihood that the signal generated by the receiver is the same as the transmitted signal, encoding schemes such as forward error correction ("FEC") encoding have been developed that enable a receiver to correct errors that result from noise and other signal interference. One encoding scheme, known as Wagner encoding, encodes information similar to parity information into the transmitted signal.

Another encoding scheme, known as trellis coded modulation ("TCM"), combines the separate processes of forward error correction coding and modulation into one process. A symbol transmitted by a transmitter that uses trellis coded modulation depends on previous symbols. This dependency is achieved by limiting the choices for each transmitted symbol based on the current and previous symbols. Both the transmitter and receiver contain information specifying the predetermined, limited choices for a symbol based on the previous symbols.

At the receiver, the sequence information of the received symbols is used to select a next symbol most likely to have been transmitted. Thus, if a symbol gets corrupted during transmission, by knowing the sequence of previously received signals, the receiver may be able to identify the correct symbol. Trellis coded modulation techniques are well known in the data communication art. For example, one TCM technique is disclosed in U.S. Pat. No. 4,980,897 to Decker et al., entitled MULTI-CHANNEL TRELLIS ENCODER/DECODER, the contents of which are incorporated herein by reference.

Several variations of the trellis coded modulation technique are used in conventional data communications systems. U.S. Pat. No. 4,077,021 to Csajka and Ungerboeck and the article "Channel Coding with Multilevel/Phase Signals", IEEE Transactions on Information Theory, Vol. IT-28, No. 1, January, 1982, both of which are incorporated herein by reference, disclose a coding system using a conventional two-dimensional signal constellation having $2^N$ signal points, wherein the size of the constellation is increased to $2^{N+1}$ signal points. The encoder in this system introduces redundancy into the transmitted signal by adding one bit of information to each N bit symbol according to the state of a finite state machine internal to the encoder. The resulting N+1 bits for each symbol are mapped into one of the $2^{N+3}$ signal points of the constellation. The signal points are organized into disjointed subsets and arranged so that the minimum Euclidean distance between two signal points belonging to the same subset is greater than the minimum distance between any two signal points in the constellation. The memory of the finite state machine is arranged so that the sequence of subsets from which signals are drawn is predetermined to provide maximum distance between signal points.

The encoder operates by selecting the subset from which each signal is to be drawn. This coding permits only certain sequences of signals to be transmitted. In essence, each signal, as part of the sequence, carries historical information which is used by the decoder. The decoder uses a maximum likelihood sequence estimation technique to decode the actual sequence of transmitted signals. One sequence estimation technique is the Viterbi algorithm which is described in Forney, "The Viterbi Algorithm", Proceedings of the IEEE, Vol. 61, No. 3, March, 1973, the contents of which are incorporated herein by reference.

Some systems use a coding technique known as multi-dimensional coding. In multi-dimensional coding, transmitted signals are grouped, each group consisting of at least two symbols. Each symbol is drawn from a two-dimensional signal constellation. An interdependence is introduced among the signal points drawn for a particular group. Through this interdependence, data correction may be accomplished using lower symbol processing rates than are used by other coding schemes.

Some systems use a layered coding technique known as multi-level coded modulation ("MLCM"). In the case of two level encoding, one group of bits is encoded by a first encoder. The output of this encoder is used as an input to a second encoder which encodes the remaining bits. If desired, the multi-level technique can be extended to more than two levels.

From the above, it can be seen that a multitude of encoding techniques are used in conventional data communication systems. In practice, a data communications user may use various services each of which employs signals that are encoded using different encoding schemes. For example, a user may subscribe to a new data service that transmits data using a different encoding technique than was used by the user's old data service. Alternatively, a user may, on a regular basis, receive more than one type of service over the same line, where each service uses a unique encoding scheme. For example, a consumer may subscribe to a video on demand service and a computer service, both of which are provided to the consumer's house via a common cable from a telephone central office.

Conventional decoders are implemented and configured for a single encoding scheme. They cannot be dynamically switched between different encoding schemes, different levels of encoding, or different coding dimensions. Thus, to provide the appropriate decoding for new services, a user would have to obtain additional decoder equipment. This can significantly increase the cost of the service to the user.

Consequently, a need exists for a decoder that can conveniently and economically decode signals that are encoded in a variety of coding formats.

SUMMARY OF THE INVENTION

A programmable signal decoder processes incoming signals using any one of several predefined decoding schemes. The decoder is programmed with a selected encoding scheme by downloading configuration data associated with the decoding scheme into programmable logic in the decoder. The decoding scheme is changed as needed by simply downloading new configuration data. Accordingly, various decoding schemes are supported by providing the appropriate configuration data.

The configuration data defines the input signals, output signals and logic operations performed by the programmable logic. To generate the configuration data for a given decoder, a circuit designer develops a circuit capable of performing the desired functions. This circuit information is converted into data suitable for downloading into the programmable logic. This data is stored in a data memory connected to the programmable decoder. System configuration circuitry downloads the configuration data from the data memory to the decoder.

One embodiment of the signal decoder comprises a generic four-level decoder structure. The first two levels are programmable Viterbi decoders. Level three is a Wagner decoder and level four provides free bit selection operations. Various levels may be combined to implement two or three level multi-level coded modulation functions. Trellis coded modulation may be provided by configuring level one as a two-dimensional or four-dimensional decoder and using levels two through four to provide free bit selection. The configuration of the trellis is specified by the programmed configuration data. The four level structure provides a high degree of flexibility wherein numerous trellis coded modulation and multi-level modulation decoding formats may be supported.

Other programmable functions are provided using data memories. Metric calculations to be performed by the decoder are specified in metric tables. A survivor depth data memory provides a programmable survivor depth value for the trellis coded modulation schemes.

Accordingly, the programmable signal decoder supports multiple decoding schemes using a single decoder structure. The decoder provides standard trellis coded modulation decoding as well as multi-level coded modulation decoding. In addition, the decoder may be configured to provide different levels of multi-dimensional decoding. Decoder configuration is accomplished using relatively simple software download operations.

BRIEF DESCRIPTION OF THE DRAWINGS

These and other features of the invention will become apparent from the following detailed description of the preferred embodiments and the claims, when taken with the accompanying drawings, wherein similar reference characters refer to similar elements throughout and in which:

DESCRIPTION OF THE PREFERRED EMBODIMENTS

Figure 1:
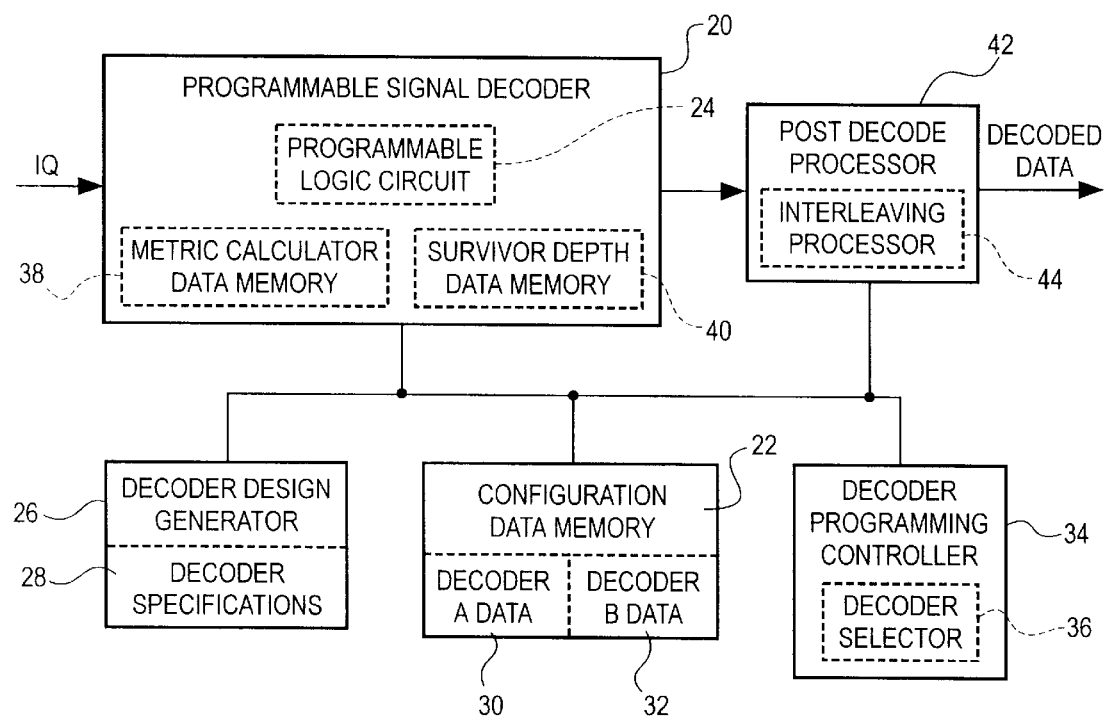
FIG. 1 is a block diagram illustrating one embodiment of a programmable signal decoder constructed according to the present invention.

Referring to FIG. 1, a programmable signal decoder 20 processes incoming signals using a selected decoding scheme. The signal decoder 20 is programmed to perform the desired decoding operations by downloading configuration data representative of the decoding scheme from a configuration data memory 22 to a programmable logic circuit 24 in the signal decoder 20. Once programmed, the programmable logic circuit 24 performs the decoding operations.

A decoder design generator 26 produces the configuration data based on selected decoder specifications 28. For example, a given application may specify a Wagner decoder or a trellis coded modulation ("TCM") decoder. The specified TCM decoder may employ a Viterbi decoding scheme. In addition, a particular trellis configuration or various levels and dimensions may be specified.

Typically, the decoder design generator 26 consists of computer-aided design tool. Using the design tool, a system designer creates a schematic or a series of logic equations representative of a decoder circuit. The decoder design generator 26 processes the schematic or equation information and produces data that can be downloaded to the programmable logic circuit 24.

A The configuration data is stored in a decoder configuration data memory 22. If the system uses more than one decoding scheme, configuration data for several decoding schemes (e.g., Decoder A Data 30 and Decoder B Data 32) may be stored in the decoder configuration data memory 22.

A decoder programming controller 34 configures the signal decoder 20. A decoder selector 36 specifies a decoder type. The decoder programming controller 34 retrieves the configuration data that corresponds to that decoder type from the configuration data memory 22 and downloads it to the programmable logic circuit 24.

The decoder programming controller 34 also transfers metric table data and survivor depth data from the configuration data memory 22 to the metric calculator data memory 38 and the survivor depth data memory 40, respectively. The metric table data is used to calculate the difference between incoming data and the expected data. The survivor depth data is used in TCM decoding. This data specifies the number of trellis segments used when comparing the received data with the predefined trellis. These components are treated in more detail below.

Once the signal decoder 20 is programmed and initialized, it processes incoming data using the specified decoding scheme. The decoded data is sent to a post decode processor 42 that performs bit processing functions, such as rail combining, de-interleaving 44, differential decoding, re-mapping and rate re-timing. These operations are discussed in more detail below. Data from the post decode processor 42 is sent to the appropriate destination (not shown).

Figure 2:
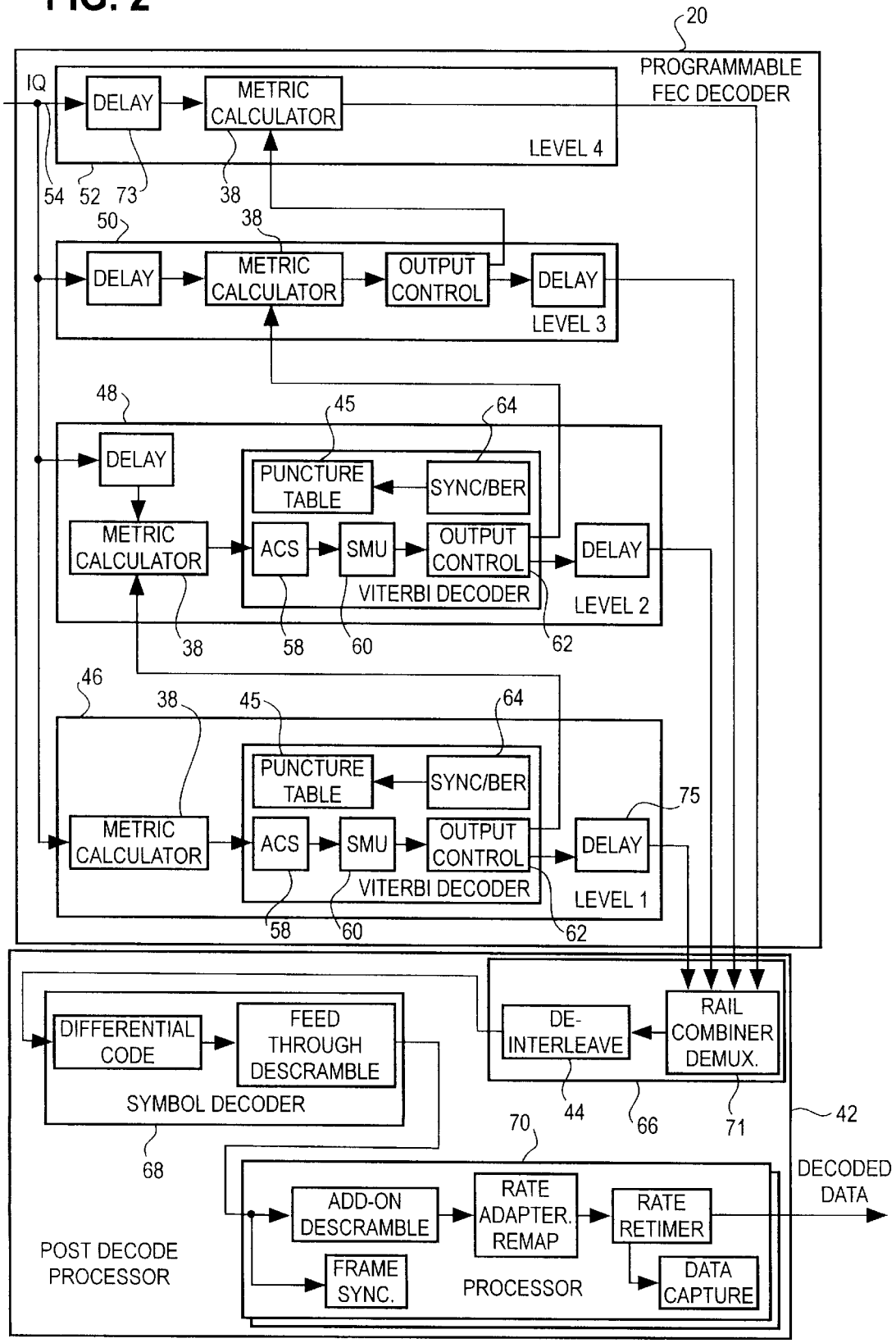
FIG. 2 is a block diagram illustrating one embodiment of a four level decoder structure constructed according to the present invention.

FIG. 2 discloses, in detail, one embodiment of a generic decoder structure 20. The decoder is configured to provide MLCM forward error correction ("FEC") decoding. The decoder structure consists of four levels of processing. Level one 46 and level two 48 are programmable Viterbi decoders. Level three 50 is a Wagner decoder. Level four 52 performs the free bit selection operations that identify the bits in the received signal that are not encoded. These four levels may be flexibly combined to implement two-dimensional, four-dimensional or multi-level coded modulation.

The operation and design of Viterbi decoders as may be implemented by level one 46 and level two 48 are well known in the data communications art. For example, Viterbi decoders are discussed in the articles "The Subtleties and Intricacies of Building a Constraint Length 15 Convolution Decoder" by Oliver M. Collins, IEEE Transactions on Communications, Vol. 40, No. 12, December 1992, pages 1810–19, and "A 100 Mbit/S Viterbi Decoder Chip: Novel Architecture and its Realization" by Gerhard Fettweis and Heinrich Meyr, IEEE, CH2829-0/90/000-0463, 1990, pages 463–67, both of which are incorporated herein by reference. Accordingly, the operation of the Viterbi decoders will only be discussed briefly.

A metric calculator 38 receives I/Q data 54 from a demodulator connected to a data source (not shown). The I/Q data consists of signals generated by a quadrature coding scheme. I and Q represent the axes of the constellation of the data. The Wagner, TCM and Viterbi coding schemes treated herein generally employ some form of quadrature encoded signals. The metric calculator 38 processes the input signal to identify subset assignments for the input signal and determine metrics and free data bits for each subset.

The metric calculator 38 is implemented as a table in random-access memory ("RAM") to provide flexible subset assignments for set metrics and free data bits. The table is specified by a user and pre-processed using software applications executing, for example, on the decoder design generator 26 (FIG. 1). For the Viterbi decoders, the metric calculator 38 provides the mapping of the set assignments to the trellis and computes the metrics required by the decoder 20. For the Wagner decoder and the free bit selection, the metric calculator 38 provides a programmable state assignment mapping function. The use of a downloadable RAM yields total code flexibility and reduces design costs by enabling a developer to implement algorithm changes by simply altering the downloaded table.

For each subset of data in the metric calculator 38, the function of the metric data is to determine the vector distance of the I/Q data point from the closest assigned subset position. The vector distance is determined as the square root of the sum of the squares and is scaled for a 3 bit unsigned value (maximum distance is 7, and minimum is 0). Software automatically determines the maximum vector distance for the non-symmetrically placed subsets and provides saturation for values outside this distance. In some cases, it may be desirable for the gain setting to vary the nominal saturation value.

Figure 3A:
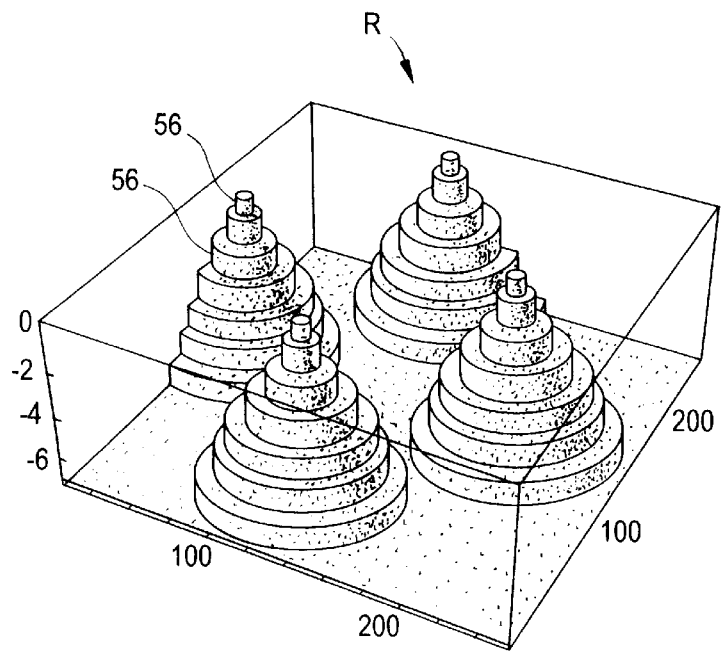
FIGS. 3a and 3b are graphic representations of a metric data table in accordance with the present invention.
Figure 3B:
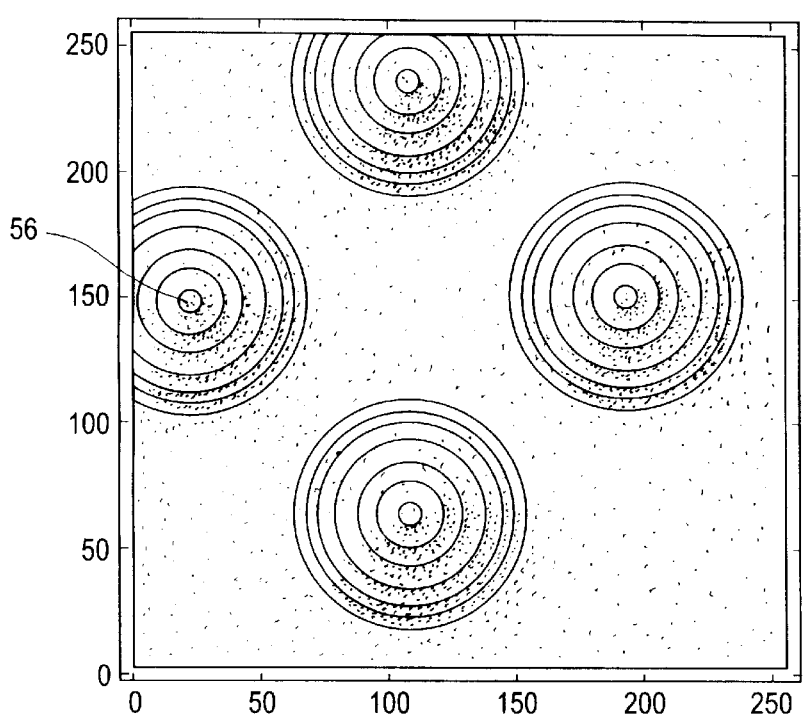

Because of the large number of data points required for these tables, a graphical method typically is used to visually display the data. FIG. 3a (perspective view) and FIG. 3b (top view) depict graphical representations R of the metrics in a metric table for a 32TCM signal utilizing two free bits. The height of the graph shows the three bit resolution for eight levels (e.g., levels 56) of metric values, while the width of the levels 56 is proportional to the metric gain.

Figure 4A:
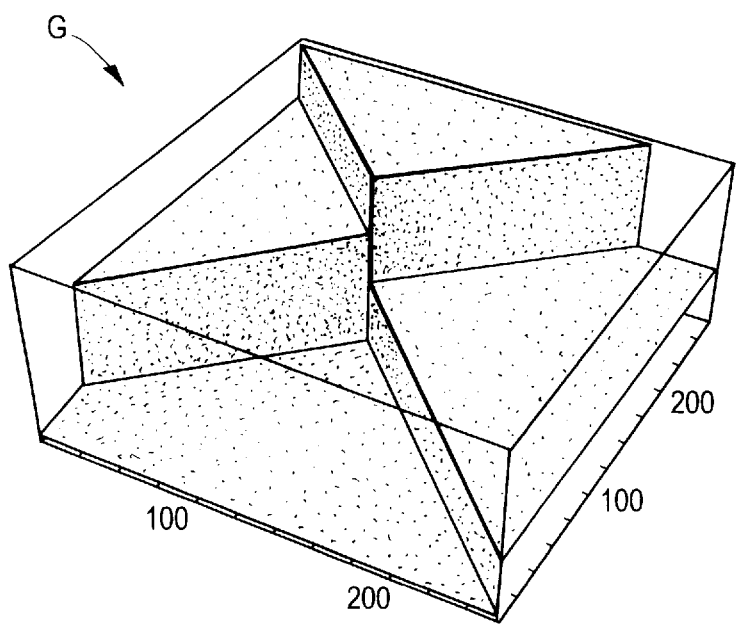
FIGS. 4a and 4b are graphic representations of a free bit plot in accordance with the present invention.
Figure 4B:
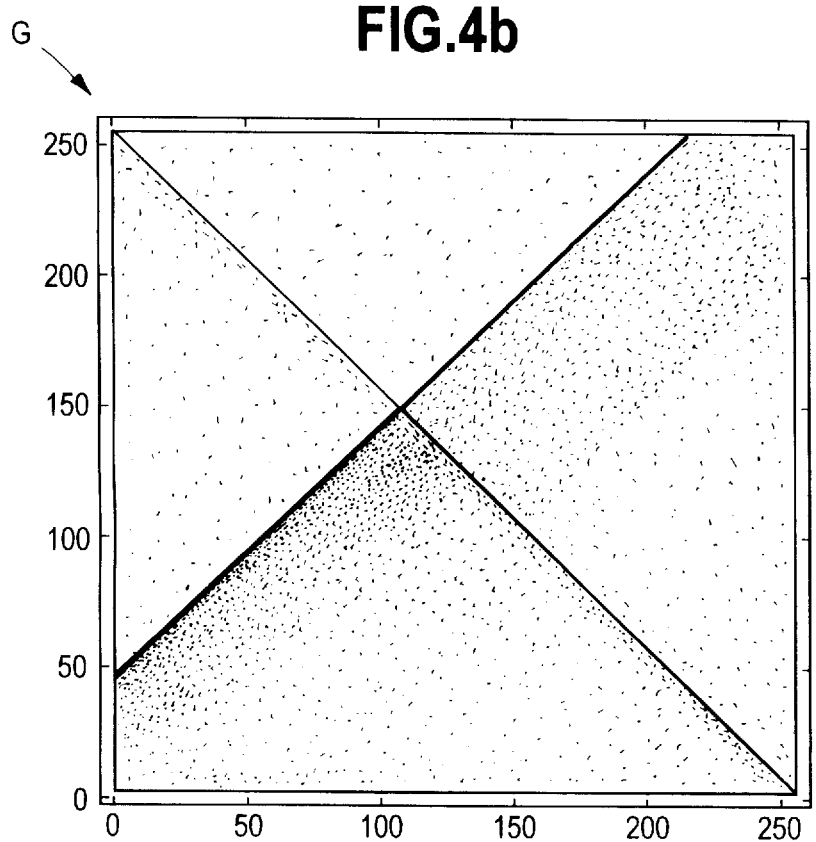

FIG. 4a (perspective view) and FIG. 4b (top view) depict graphical representations G of the two free bit assignments for the same 32TCM subset example. Each plane represents the assignment of binary values: 00, 01, 10, and 11.

An add-compare-select ("ACS") unit 58 (FIG. 2) performs set selection assignment, add, minimize, puncture selection and some normalization functions for each node in the trellis. Set selection is a programmed function which selects the subset assigned to the node of the trellis branch currently being processed. The selection is fixed to the trellis. The selection for each node is provided by the metric table. The add function implements the addition of an N bit branch with a 3 bit metric to produce an N+1 bit value. The minimize function compares the unsigned binary values of four N+1 bit paths, and selects the minimum data path.

Puncture coding is a technique which allows a low-rate encoder to produce the equivalent of a high-rate coding function. This technique is described in the publications "High Rate Punctured Convolutional Codes for Soft Decision Viterbi Decoding," by Y. Yasuda, K. Kashiki, and Y. Hirata, IEEE Trans. Communications, Vol. COM-32, 1984, pp. 315–319, and "Development of Variable-Rate Viterbi Decoder and its Performance Characteristics," by Y. Yasuda, Y. Hirata, K. Nakamure, and S. Otani, Proc. of Sixth ICDSC, Phoenix, Ariz. 1983, pp. XII-24-31, both of which are incorporated herein by reference. Puncture coding involves removing encoder states according to a predetermined "puncture pattern." Synchronization to the pattern is provided at the decoder. Puncture selection provides the capability to decode any of the several puncture codes, and provide the hardware to synchronize to that code.

The normalization function monitors the most-significant-bit of each path metric to determine whether the value has exceeded ½ of the maximum range of the number format. Under normal conditions, a normalization request will initiate subtraction of a fixed value of ¼ from all the path metrics after a delay of 1 clock cycle. In addition, a second request will be prevented during the current cycle.

Several unusual conditions of path overflow/underflow are accounted for by the normalization function. These conditions are identified by TABLE 1.

TABLE 1

| LINE | NORM IN | PATH IN (MSB) | PATH OUT (MSB) | NORM OUT | COMMENT |
| --- | --- | --- | --- | --- | --- |
| 1 | 0 | 00 | 00 | 0 | Nominal |
| 2 | 0 | 01 | 01 | 0 | Nominal |
| 3 | 0 | 10 | 10 | 1 | Normalize Request |
| 4 | 0 | 11 | 11 | 1 | Normalize Request; Overflow |
| 5 | 1 | 00 | 00 | 0 | Underflow |
| 6 | 1 | 01 | 00 | 0 | Subtract ¼ |
| 7 | 1 | 10 | 01 | 0 | Subtract ¼ |
| 8 | 1 | 11 | 10 | 1 | Subtract ¼; Normalize Request |

Subtraction by clipping the two most significant bits provides correct arithmetic for the top ¾ of the arithmetic range. The bottom ¼ of the range (LINE 5) is not modified, producing an arithmetic error. For the case where the path value is in the top ¼ of the range (LINE 8), a second normalization request is issued.

A survivor memory unit ("SMU") 60 provides survivor memory storage. The SMU 60 performs two primary functions: trace and read.

The SMU trace function uses data stored in the SMU memory to determine the best path through the trellis. Tracing begins from an arbitrary node at each SMU state and proceeds through the trellis to the final selection. During each cycle, the currently selected node and the data from that node allows selection of the next node in the trellis. The node map must be programmed to match the external trellis connection. In this implementation, mapping is fixed for the decoder implementation.

The SMU read function provides an independent but similar trace function as SMU trace. SMU read tracing begins by selecting the final node value from SMU trace. The tracing proceeds through the trellis by using data stored in the SMU memory to determine the best path through the trellis. In addition to the best path through the trellis, the node map provides the actual subset selection and data. SMU read is delayed by one cycle from trace. This is implemented to pipeline the passing of the final trace value to the SMU read function.

The SMU function is implemented in static RAM with a multi-pointer trace-back routine. The use of RAM allows the user to program the survivor depth as necessary. As discussed briefly above, the survivor depth specifies the number of stages of the trellis that are used in the trellis decoding process. Because the decoder disclosed herein provides a programmable survivor depth, it can be optimized for particular signals and particular signal-to-noise environments.

In one embodiment, the SMU 60 is implemented in a XILINX 4000 series field programmable gate array ("FPGA"). This chip has internal function generators which may be utilized as 1×16 RAM. Implementation of this RAM for synchronous operation (symbol clock rates) is specified in reference XAPP 042.000, "High Speed RAM Design in SC4000".

A SYNC/BER function 64 (implemented in an FPGA) determines bit error rate ("BER") estimation and synchronization of the Viterbi decoder. An output control 62 provides a programmable mapper for coded bits (for the Viterbi decoders) and free bits. Differential decoding (differential mapping) is provided as a programmable Mod N mapper for levels one, two and three.

The synchronization circuit 64 is used in multi-dimensional and multi-level implementations. Multi-dimensional encoding may be used to enhance processing gain and reduce the Viterbi processing rate. Four dimensional encoding involves sending two two-dimensional symbols consecutively in time, on the same carrier. Decoding of this signal requires a synchronization process to group the two two-dimensional symbols. The operation and design of multi-dimensional decoders is well known in the data communications art. For example, multi-dimensional decoders are discussed in the article "Trellis-Coded Modulation with Multidimensional Constellations" by Lee-Fang Wei, IEEE Transactions on Information Theory, Vol. 33, No. 4, July 1987, pages 483–501, which is incorporated herein by reference.

Multi-level decoding is implemented by connecting the level one 46 and level two 48 decoders and modifying the associated decoder programming. The levels are connected via line 77. The operation and design of multi-level decoders is also well known in the data communications art. For example, multi-level decoders are discussed in the articles "An Adjustable-Rate Multilevel Coded Modulation System: Analysis and Implementation" by Paolo Cremonesi, et al., ETT, Vol 4, No. 4, May–June 1993, page 277–83 and "Multilevel Codes Based on Partitioning" by Gregory J. Pottie, IEEE Transactions on Information Theory, Vol. 35, No. 1, January 1989, pages 87–98, both of which are incorporated herein by reference.

Synchronization is independently determined at various places in the decoding architecture by monitoring bit error rate performance. The Viterbi decoders are monitored for path normalization rate and pseudo-error rate based on the re-encode and compare technique. The Wagner decoder is monitored for bit quality. The post decode processor is monitored for frame sync.

Synchronization is provided for MLCM by shifting the phase of the constellation at the input in $K\Pi/2$ rotations and by shifting the phase of the puncture tables (e.g., 45 in FIG. 2). Synchronization is detected in states beginning at level one 46, working up to level three 50 where the block length of the Wagner code must be synchronized. Lastly, frame sync is detected in the post decode processor.

For four-dimensional trellis coded modulation, the same monitor locations are used in the Viterbi decoder. However, bi-symbol synchronization and constellation phase are adjusted.

Each of the synchronization locations are adjustable for error rate prior to declaring sync or loss of sync. Each of the synchronization parameters may be commanded to hold sync position or re-acquire sync by appropriate commands.

A delay circuit 75 delays the signals to match the delay of other signals through the various components. The delay circuits are implemented using first-in first-out ("FIFO") data memories. The FIFOs are programmed to specify the desired delay time.

In one embodiment, each Viterbi decoder is implemented on a daughter-board. The use of a daughter-board simplifies the design and allows for future upgrading of the large FPGAs to the best technology for speed and cost effectiveness. Preliminary estimates from routing of the ACS function indicate that a complete R=½, K=7 (64 State) trellis operating at over 35 MHZ will fit within a single FPGA. Keeping this portion of the design within a single FPGA is important due to the number of data paths which would have to traverse the boundaries of the chips if the design was broken into two or more chips. The use of an FPGA-based daughter-board design, rather than using commercial Viterbi decoder chips, yields a more flexible and efficient design, with easy re-programmability and a decoder design tailored to each code. This approach reduces the design risk as compared to adapting fixed commercial chips to the present application.

Level three 50 implements a Wagner decoder for various word widths. The Wagner decoder is a simple algorithm implemented by a programmable state machine. It uses soft decisions to correct the most likely error. Wagner decoding is discussed, for example, in the text *Error-Control Techniques for Digital Communications,* by Arnold M. Michelson and Allen H. Levesque, John Wiley & Sons, 1984, pages 55 and 162–166.

Level four 52 provides free bit selection and may be combined with level two 48 and level three 50 for additional width. Set assignment mapping is implemented by using the metric calculator 38 as a look-up table. A free bit delay circuit 73 provides a delay for the IQ signal which matches the delay of the coded bits through the ACS 58, the SMU 60 and other components.

The post decoder processing functions are implemented by an FPGA 66, a symbol decoder 68 and a processor 70. The FPGA performs rail combining, rail demultiplexing, and de-interleaving (burst decoding) functions. A rail combiner and demultiplexer circuit 71 selects the appropriate output signals from the level or levels used in the selected decoder implementation. Rail combining allows final level-based rail assignments to word-based rail assignments. A de-interleave circuit 44 provides reordering of a sequence of symbols. Through appropriate programming of the FPGA 66, the de-interleaving may be specified for user defined delays up to a predefined number of symbols.

The symbol decoder 68 provides differential decoding and provides descrambling for feed through scrambling techniques. The processor 70 provides final bit processing functions. Descrambling is provided for add-on scrambling techniques. Frame synchronization is programmable for add-on descrambling. The processor 70 also provides output re-railing, and rate re-timing (to provide a smooth resulting data rate). The output of the post decode processor is the final decoded data.

The generic decoder may be configured to implement decoding schemes other than those listed above. This is accomplished by modifying the schematics or logic equations that define the appropriate portions of the decoder. For example, to implement a TCM decoder other than a Viterbi decoder, the schematics or equations of the ACS 58, SMU 60 and output control 62 are modified. The required modifications may be obtained from appropriate specifications and literature for the desired TCM decoder. The modified schematics or equations are compiled (e.g., by the decoder design generator 26 in FIG. 1) to generate the configuration data. Instructions for developing and programming a typical FPGA manufactured by Xilinx are provided in the book: "The Programmable Logic Data Book," Xilinx, 1994. The configuration data is stored in the configuration data memory 22 (FIG. 1) and downloaded to the generic decoder structure 20 when needed.

Figure 5:
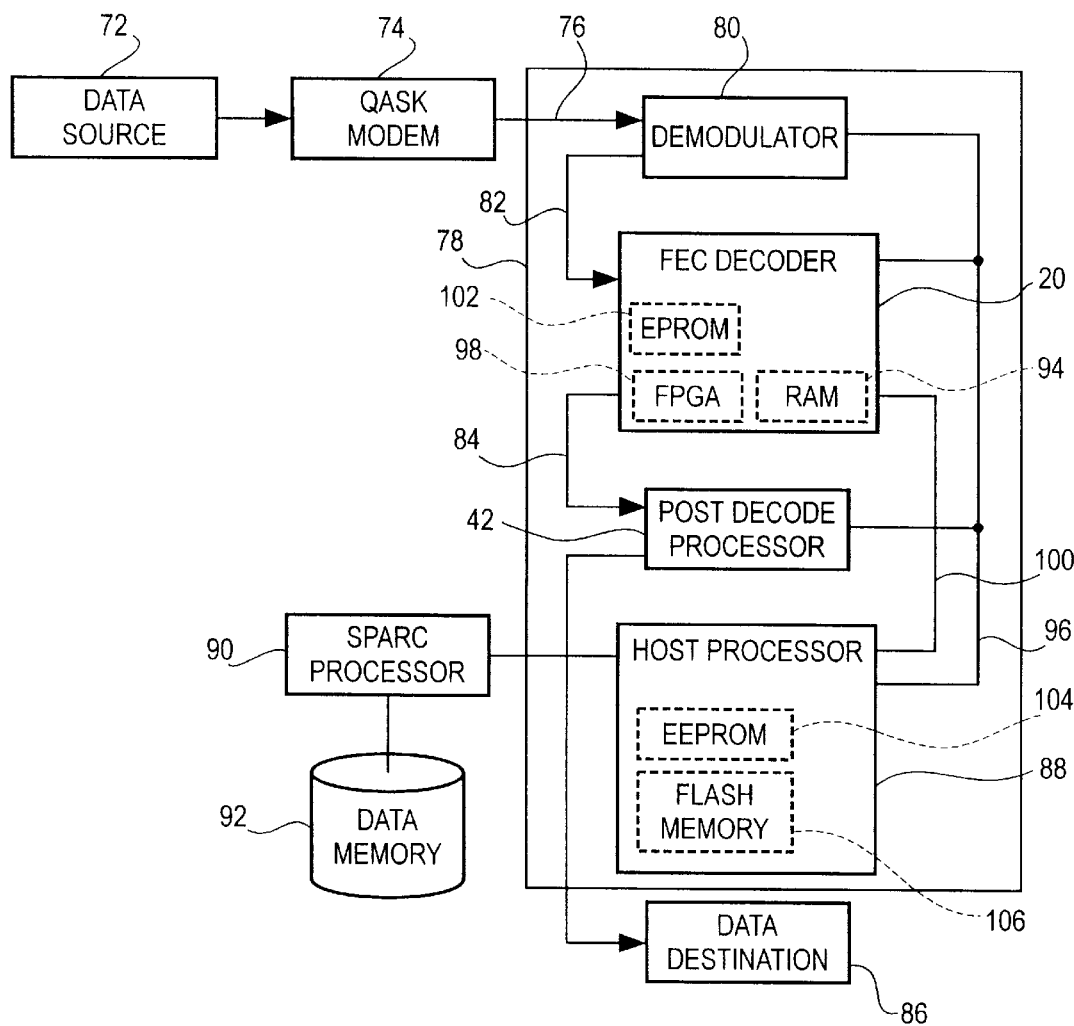
FIG. 5 is a block diagram illustrating one embodiment of a data communications system incorporating a programmable signal decoder constructed according to the present invention.

FIG. 5 describes one embodiment of a data communications system incorporating the programmable FEC decoder described herein. Signals from a data source 72 are encoded and modulated by a modulator 74 and sent over a line 76 to a receiver 78. A demodulator 80 processes the incoming signal, then sends the baseband, demodulated signal to the FEC decoder 20 via line 82. The FEC decoder 20 processes the signal and sends the signal over line 84 to a post decode processor 42 as discussed above. The post decode processor 42, in turn, sends the decoded signal to the data destination 86.

The receiver components are controlled by a host processor 88 and a SPARC processor 90. In one embodiment, the SPARC processor 90 initializes the decoder by retrieving configuration data from a data memory 92 and sending the data and appropriate commands to the host processor 88. The host processor 88 sends the data for the FEC decoder RAMs 94 to the receiver components via a VME bus 96. The host processor 88 sends the data for the FEC decoder FPGAs 98 to the receiver components via a serial bus 100. Alternatively, the configuration information may be stored in erasable programmable read-only memories ("EPROMs") 102 located on the FEC decoder 20.

In another embodiment, the configuration data is stored in an electrically erasable programmable read-only memory ("EEPROM") 104 in the host processor 88. Upon receipt of the appropriate command from the SPARC processor 90, the host processor retrieves the configuration data from the memory 104 and sends it to the decoder 20 as discussed above, if applicable.

Decoder control is accomplished by invoking built-in script processes which are stored in the FLASH memory 106 in the host processor 88 and are available after power is applied to the system. Control messages contain the name of the function to be executed and any necessary parameters.

When the host processor 88 receives a valid control message, it configures the decoder 20 and any configuration information in a battery-backup RAM (not shown) is updated to support reconfiguration upon power failure. The decoder 20 uses two primary programming commands. The set decoder format command allows the user to select the decoder processing format from one of several signal sets defined by Manufacturer radio models. The set mapping command allows the user to select the decoder absolute and differential bit maps.

Figure 6:
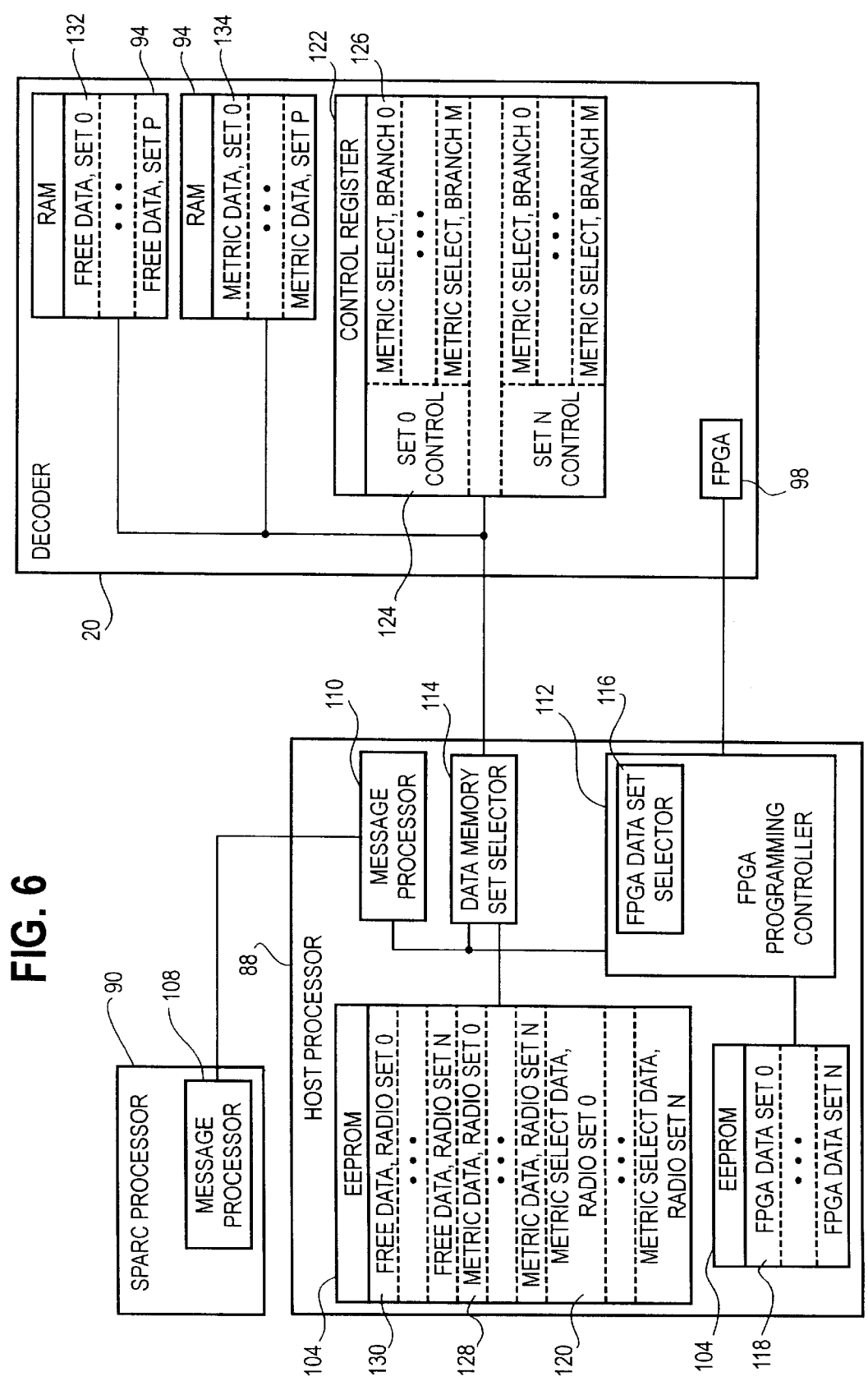
FIG. 6 is a block diagram illustrating the data flow associated with the programming of the decoder in one embodiment of the present invention.

FIG. 6 illustrates the programming operation in more detail. The EEPROMs 104 (left) store the FPGA data, the metric data and the free data for several radio model signal sets. The programming commands specify which signal set is programmed into the decoder 20 (right).

A message processor 108 in the SPARC processor 90 (top left) sends the set decoder format command to a message processor 110 in the host processor 88. The message processor 110 sends a SET ID signal to an FPGA programming controller 112 and a data memory set selector 114. Based on the SET ID, an FPGA data set selector 116 selects one of the FPGA data sets (e.g., FPGA data set 0 (118)) in the EEPROM 104. Using the selected FPGA data set, the FPGA programming controller 112 programs the FPGA 98 in the decoder 20 as previously discussed.

The data memory set selector 114 retrieves one set of metric select data (e.g., metric select data, radio set 0 (120)) from the EEPROM 104 based on the SET ID and transfers it to a control register 122 in the decoder 20. The metric select data consists of several sets (e.g., set 0 control (124)), each of which includes data (e.g., metric select, branch 0 (126)) for the branches of the trellis.

The message processor 108 in the SPARC processor 90 also sends the set mapping command to the message processor 110 in the host processor 88. The message processor 110, in turn, sends a SET ID signal to the data memory set selector 114. Based on the SET ID, the data memory set selector 114 retrieves one set of metric data (e.g., metric data, radio set 0 (128)) and one set of free data (e.g., free data, radio set 0 (130)) from the EEPROM 104 and transfers it to RAM 94 in the decoder 20.

The metric select data, metric data and free data for each radio set includes several data sets (e.g., sets 124, 132 and 134), depending on the signal set specifications. For example, a 32TCM signal typically would incorporate eight sets for each data type.

In general, the components discussed above may be implemented using a variety of components. For example, the programmable logic may be implemented using FPGAs made by a variety of vendors. In addition, custom devices or general purpose computing devices may be used for some of the non-programmable components depending on cost and performance requirements. Moreover, various operations may be performed by software executing on a processor. The data memories specified above typically are conventional FIFOs and random-access memories.

From the above, it may be seen that the disclosed invention provides an effective FEC decoder that supports multiple decoding formats. While certain specific embodiments of the invention are disclosed as typical, the invention is not limited to these particular forms, but rather is applicable broadly to all such variations as fall within the scope of the appended claims. To those skilled in the art to which the invention pertains many modifications and adaptations will occur. For example, various decoding techniques, trellis configurations, metric tables and programmable logic devices may be used in practicing the claimed invention. Thus, the specific structures and methods discussed in detail above are merely illustrative of a few specific embodiments of the invention.

What is claimed is:

1. A signal decoder for decoding data signals according to at least one decoding format, comprising:
   a data memory for storing configuration data associated with at least one decoding format;
   a programmable logic circuit which is programmable with said configuration data, said logic circuit acting to decode said signals according to said at least one decoding format associated with said configuration data; and
   a programming controller which programs said logic circuit with said configuration data.

2. A signal decoder according to claim 1 further comprising a decoder selector for selecting one of said at least one decoding format.

3. A signal decoder according to claim 1 further comprising a metric calculator data memory for storing a metric table, said metric table defining a mapping of a set assignment to a trellis.

4. A signal decoder according to claim 1 further comprising a survivor depth data memory for storing at least one survivor depth value.

5. A signal decoder according to claim 1 wherein said programmed logic circuit includes at least one Viterbi decoder.

6. A signal decoder according to claim 5 wherein said programmed logic circuit includes at least one Wagner decoder.

7. A signal decoder according to claim 6 wherein said programmed logic circuit includes at least one free bit selector.

8. A signal decoder according to claim 1 wherein said configuration data defines a trellis configuration.

9. A signal decoder according to claim 1 wherein said programmed logic circuit defines a multi-dimensional decoder.

10. A signal decoder according to claim 1 wherein said programmed logic circuit defines a multi-level coded modulation decoder.

11. A signal decoder according to claim 1 wherein said configuration data defines a reordering of a sequence of symbols.

12. A signal decoder according to claim 1 further comprising a decoder design generator for producing said configuration data.

13. The signal decoder of claim 1 wherein said logic circuit decodes said signals according to a plurality of decoding formats, said logic circuit decoding a plurality of decoding formats performed in parallel processes such that signals encoded according to different formats are decoded simultaneously by said logic circuit.

14. The signal decoder of claim 1 wherein said programmable logic circuit decodes a plurality of decoding formats.

15. The signal decoder of claim 1 wherein said programmable logic circuit includes at least one Viterbi decoder and at least one Wagner decoder.

16. A method for decoding data signals according to at least one decoding format, including the steps of:
    defining configuration data according to a decoding format;
    storing said configuration data in a data memory;
    programming a logic circuit with said configuration data; and
    decoding said signals using said programmed logic circuit.

17. A method according to claim 16 further including the step of selecting one of said at least one decoding format.

18. A method according to claim 16 further including the steps of:
    defining a metric table as a mapping of a set assignment to a trellis; and
    storing said metric table in a data memory.

19. A method according to claim 16 further including the step of storing at least one survivor depth value in a data memory.

20. A method according to claim 16 further including the step of defining said configuration data as at least one Viterbi decoder.

21. A method according to claim 20 further including the step of defining said configuration data as at least one Wagner decoder.

22. A method according to claim 21 further including the step of defining said configuration data as at least one free bit selector.

23. A method according to claim 16 further including the step of defining said configuration data as a trellis configuration.

24. A method according to claim 16 further including the step of defining said configuration data as a multi-dimensional decoder.

25. A method according to claim 16 further including the step of defining said configuration data as a multi-level coded modulation decoder.

26. A method according to claim 16 further including the step of defining said configuration data as a reordering of a sequence of symbols.

27. A method according to claim 16 further including the steps of:
    defining configuration data according to a plurality of decoding formats; and
    decoding said signals such that signals encoded according to different formats are decoded simultaneously using said programmed logic circuit.

28. A method according to claim 16 further including the step of defining configuration data according to a plurality of decoding formats, said plurality of decoding formats including Viterbi and Wagner decoding formats.

29. A method according to claim 16 further including the steps of:
    defining configuration data according to a plurality of decoding formats, said plurality of decoding formats including Viterbi and Wagner decoding formats; and
    decoding said signals such that signals encoded according to Viterbi and Wagner decoding formats are decoded simultaneously using said programmed logic circuit.

30. A signal de coder for decoding data signals according to at least one decoding format, comprising:
    at least one metric calculator data memory for calculating a plurality of branch metrics from said signals;
    at least one programmable add-compare-select circuit for accumulating said branch metrics;
    at least one programmable survivor memory unit for calculating a path based on said branch metrics; and
    at least one programmable output control for generating a decoded signal using said path.

31. A signal decoder according to claim 30, further comprising:
    at least one data memory for storing configuration data associated with said at least one metric calculator data memory, said at least one add-compare-select circuit and said at least one survivor memory unit; and a programming controller for programming said at least one metric calculator data memory, said at least one add-compare-select circuit and said at least one survivor memory unit with said configuration data.

32. A method for decoding data signals, including the steps of:

storing, in a data memory, a metric table representative of a mapping of a set assignment to a trellis;

calculating a plurality of branch metrics using said signals and said metric table;

programming at least one logic circuit with first programming data defining add, compare and select functions for accumulating said branch metrics;

programming said at least one logic circuit with second programming data defining a survivor memory unit for calculating a path based on said branch metrics; and decoding said signals by calculating a plurality of branch metrics using said signals and said metric table, accumulating said branch metrics and calculating a path based on said branch metrics.

33. A method according to claim 32 further including the step of defining a configuration for said trellis.

34. A method according to claim 32 further including the step of programming said logic circuits to define at least two of said add, compare and select functions and said survivor memory units to provide a multi-level coded modulation decoder.

35. A method according to claim 32 further including the step of programming said logic circuits to define multi-dimensional add, compare and select functions and survivor memory units.

36. A method for programming an apparatus to provide a programmable signal decoder, including the steps of:

defining a metric table representative of a mapping of a set assignment to a trellis;

storing said metric table in a data memory;

defining first programming data representative of add, compare and select functions for accumulating branch metrics;

defining second programming data representative of a programmable survivor memory unit for calculating a path based on said branch metrics; and programming at least one logic circuit with said first and second programming data.

* * * * *

UNITED STATES PATENT AND TRADEMARK OFFICE
CERTIFICATE OF CORRECTION

PATENT NO. : 6,205,187 B1
DATED : March 20, 2001
INVENTOR(S) : Dan L. Westfall

Page 1 of 1

It is certified that error appears in the above-identified patent and that said Letters Patent is hereby corrected as shown below:

Column 2,
Line 9, delete "$2^{N+3}$" and insert -- $2^{N+1}$ --

Column 4,
Line 37, delete "A"

Column 12,
Line 53, delete "de coder" and insert -- decoder --

Signed and Sealed this

Twenty-eighth Day of August, 2001

*Attest:*

*Attesting Officer*

NICHOLAS P. GODICI
*Acting Director of the United States Patent and Trademark Office*